(12) United States Patent
Nogami

(10) Patent No.: US 6,934,159 B2
(45) Date of Patent: Aug. 23, 2005

(54) CARD CONNECTOR

(75) Inventor: Daisuke Nogami, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 181 days.

(21) Appl. No.: 10/366,461

(22) Filed: Feb. 14, 2003

(65) Prior Publication Data

US 2003/0151901 A1 Aug. 14, 2003

(30) Foreign Application Priority Data

Feb. 14, 2002 (JP) ........................................ 2002-036623

(51) Int. Cl.[7] .............................................. H05K 7/00
(52) U.S. Cl. ...................... 361/726; 361/801; 439/92.3; 211/41.12
(58) Field of Search .............................. 361/724–727, 361/679–687, 737, 741, 801; 70/85, 95; 211/41.17, 26.2; 439/923, 152, 155, 374

(56) References Cited

U.S. PATENT DOCUMENTS 6,587,348 B2 * 7/2003 Kondo ........................ 361/741

6,757,172 B2 * 6/2004 Maruyama ................... 361/737

FOREIGN PATENT DOCUMENTS

JP 2001-118633 4/2001

* cited by examiner

Primary Examiner—Hung Van Duong
(74) Attorney, Agent, or Firm—Takeuchi & Takeuchi

(57) ABSTRACT

A card connector for electrically connecting a card (21) and a circuit board comprises a housing (22) for accommodating the card detachably in a back-and-forth direction, an ejector (38) provided in the housing and movable with the card in the back-and-forth direction, ejector locking means (45 and 46) for locking the ejector with respect to the housing at an insertion position, card locking means (49) for locking the card with respect to the ejector, and a spring member (44) having a resilient force to the card locking means such that the resilient force becomes stronger as the card and the ejector move forwardly.

7 Claims, 9 Drawing Sheets

CARD CONNECTOR

BACKGROUND OF THE INVENTION

1. Field of the Invention

The invention relates to a card connector of electrically connecting a card incorporating ICs and/or memories, and a circuit board.

2. Description of the Related Art

Recently, electronic apparatus, such as a portable telephone, is provided with a card connector for accommodating a card including a memory device. Such a conventional acrd connector is described in Japanese Patent Application Kokai Number 2001-118633.

In FIGS. 7–9, the conventional card connector comprises a housing 2 for accommodating a card 1, a plurality of terminals 4 provided in a front wall 3 of the housing, a slider 6 slidable along a side wall 5 of the housing 2 in a back-and-forth direction, a lock mechanism 7 to control the movement of the slider 6 with respect to the housing 2, and a spring 8 provided between the housing 2 and the slider 6 for biasing the slider 6 rearwardly.

The slider 6 has a leaf spring 9 which is flexes and deforms in a lateral direction with the front end thereof as a fulcrum. The leaf spring 9 has an engaging section 10 which is bent inwardly to engage an engaging recess 11 that is provided a side of the card 1. An auxiliary leaf spring 12 provided along the side wall 5 of the housing 2 such that it flexes in the lateral direction with its front end as a fulcrum.

The lock mechanism 7 has an ejector button 13 which is to be pushed inwardly and biased by a spring body 14 outwardly so that it returns to the original position after pushed inwardly. The ejector button 13 has an engaging part 15 at the front top thereof to engage a wedge-shaped engaging projection 16 that is provided in the slider 6.

In FIG. 7, when the card 1 is inserted into the housing 2 from the rear side of the housing, the engaging section 10 of leaf spring 9 engages the engaging recess 11 of the card 1 to temporarily hold the card 1 in the slider 6. When the card 1 is further pushed against the resilient force of the spring body 8, the engaging projection engages the engaging part 15 to move it inwardly against the resilient force of the spring body 14 and advances and ride across the engaging part 15. In FIG. 8, when the engaging projection 16 rod across the engaging part 15, the engaging part 15 returns to the original position by the resilient force of the spring body 14, thus the slider 6 is locked with respect to the housing 2. Under this condition, the outward deformation of the leaf spring 9 is limited by an inside surface 17 of the side wall 5 of the housing 2 so that the card 1 is locked to the slider 6 and thus accommodated at an insertion position in the housing 2.

In order to remove the card 1 from the housing 2, the ejector button 13 is depressed. The engagement between the engaging section and projection 15 and 16 is released so that the slider 6 retreats with the card 1 to the temporarily-held position by the resilient force of the spring 8. In FIG. 9, when the card 1 is pulled backwardly, the leaf spring 9 flexes and deforms outwardly against the resilient force of the auxiliary leaf spring 12 to disengage the engaging section 10 from the engaging recess 11, thus enabling removal of the card 1 from the housing 2.

However, in the conventional card connector described in Japanese Patent Application Kokai Number 2001-118633, if the card 1 is forcibly pulled rearwardly from the insertion position, an excessive stress is applied to the side wall 5 of the housing 2 through the leaf spring 9 so that the side wall 5 can be broken or the leaf spring 9 can be deformed.

Also, the auxiliary leaf spring 12 is provided to strengthen the resilient force of the leaf spring 9 to prevent the card 1 from spring out from the temporarily-held position of the housing 2. It makes the structure of the card connector complicated and increases the manufacturing cost.

SUMMARY OF THE INVENTION

Accordingly, it is an object of the invention to provide a card connector capable of preventing the breakdown of the housing 2 even if the card 21 is forcibly taken out from the insertion position and reducing the number of parts and the manufacturing cost.

According to one aspect of the invention, there is provided a card connector for electrically connecting a card and a circuit board which comprises a housing for accommodating the card detachably in a back-and-forth direction, an ejector provided in the housing and movable with the card in the back-and-forth direction, ejector locking means for locking the ejector at an insertion position in the housing, card locking means for locking the card to the ejector, and a spring member having a resilient force to the card locking means such that the resilient force becomes stronger as the card and the ejector move forwardly.

It is preferred that the spring member is a spring which is provided between the housing and the ejector to bias the ejector rearwardly, and the card locking means is supported by the ejector at one end thereof such that it is displaced in a lateral direction and has an engaging piece to engage a rear end of the spring and an engaging section to engage the card so that when the engaging piece compresses the spring as the card and the ejector move forward, the resilient force of the spring becomes stronger against the card locking means.

The card locking means may be a leaf spring.

The card locking means may engage the card to temporarily hold the card at a temporarily-held position which is provided behind the insertion position.

The spring member may be a leaf spring which is provided in parallel to the card locking means and cantilevered by the ejector. The card locking means may be supported by the ejector at one end thereof such that the card locking means is displaced in a lateral direction and has an abutting face to abut against the spring means and an engaging section to engage the card. The housing may have a projection to abut against the spring means so that when an abutted point between the projection and the spring means moves toward a free end of the leaf spring as the card and the spring means move forward, the resilient force to the card locking means becomes stronger.

The spring member may be a leaf spring which is provided in parallel to the card locking means and cantilevered by the housing. The card locking means may be supported by the ejector at one end thereof such that the card locking means is displaced in a lateral direction and has an abutting face to abut against the spring means and an engaging section to engage the card so that when an abutted point between the abutted face and the spring means moves toward a cantilevered side of the leaf spring as the card and the spring means move forward, the resilient force with respect to the card locking means becomes stronger.

According to the invention, even if the card is forcibly removed from the insertion position, the spring means absorbs the displacement of the card locking means to prevent the housing from being broken or the card locking means from being deformed, thus increasing the durability of the product.

DESCRIPTION OF THE PREFERRED EMBODIMENT

Figure 1:
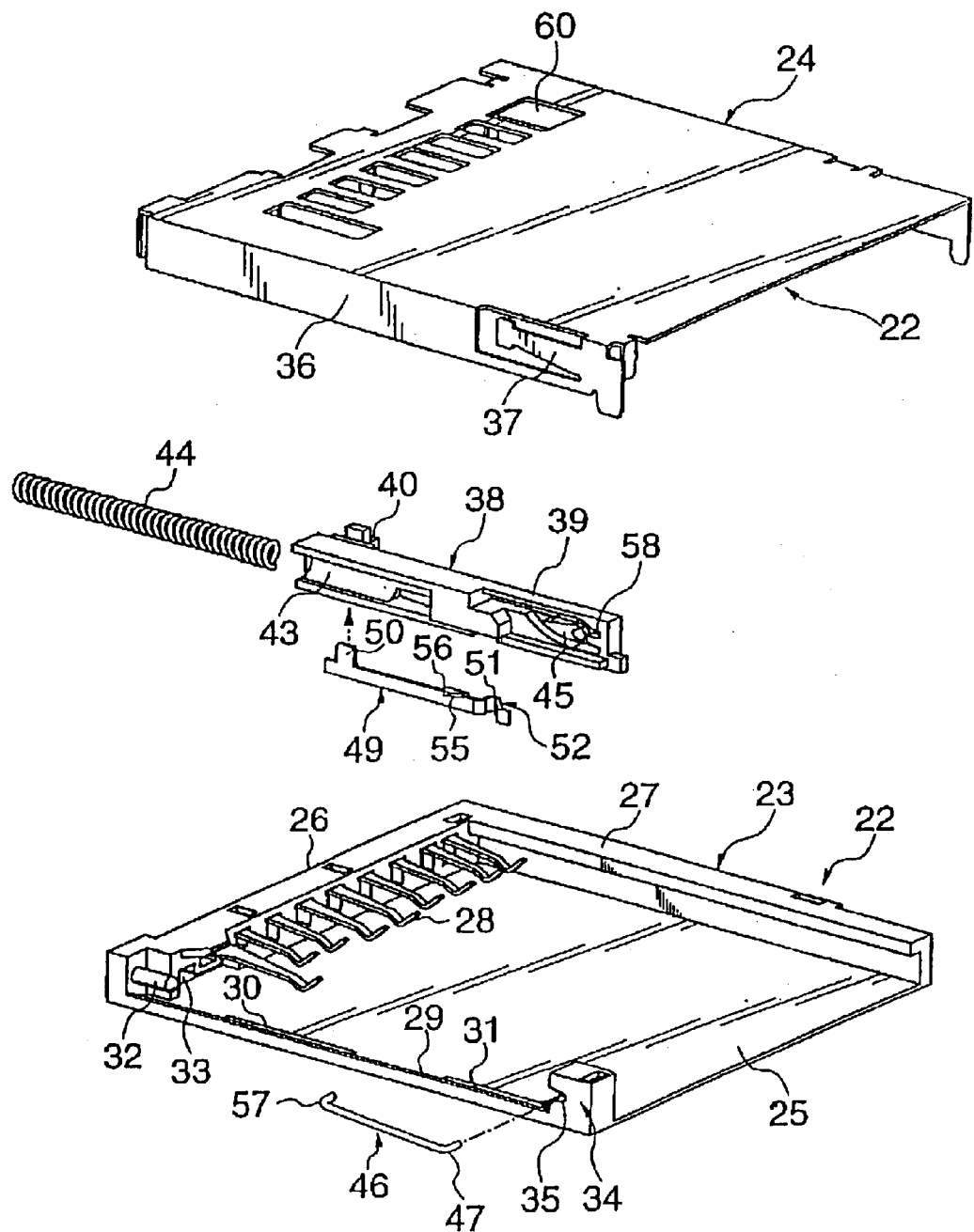
FIG. 1 is an exploded perspective view of a card connector according to an embodiment of the invention.

In FIG. 1, a card connector is provided with a housing 22 to detachably accommodate a card 21 in a back-and-forth direction. The housing is composed of a housing body 23 which is made of a resin so as to open on upper and rear sides and a housing cover 24 which is made of a metal and covers the upper side of the housing body 23. The housing body 23 has a thin bottom plate 25, a front wall 26 provided at the front end of the bottom plate 25, and a side wall 27 provided at one of sides of the bottom plate 25. A predetermined number (nine in the drawing) of terminals 28 is press-fitted into the front wall 26 in parallel to each other in the back-and-forth direction. A front portion of each terminal 28 projects through the front wall 26 into the outside of the housing body 23.

A side wall 29 is provided at the other side of the bottom plate 25. The side wall 29 has a first guiding slit 30 and a second guiding slit 31, which are provided along the inside surface of the side wall 29 in a row in the back-and-forth direction. A cylindrical boss 32 is provided at a side portion of the front wall 26 in front of the first guiding slit 30 and extends rearwardly. An engaging recess 33 is provided on the side of the cylindrical boss 32. A corner wall 35 is provided behind the second guiding slit 31. A pin hole 35 is provided at an outer front end of the corner wall 34.

The side edges of the housing cover 24 are bent downwardly so that the housing cover 24 covers the housing body 23. A bent portion 36 of the housing cover 24 has, at a rear end thereof, a pin pressing member 37 which is bent so as to extend forwardly and diagonally to the inside. The predetermined number (nine in the drawing) of windows 60 are provided in the upper surface of the housing cover 24 at positions corresponding to the terminals 28.

Figure 2:
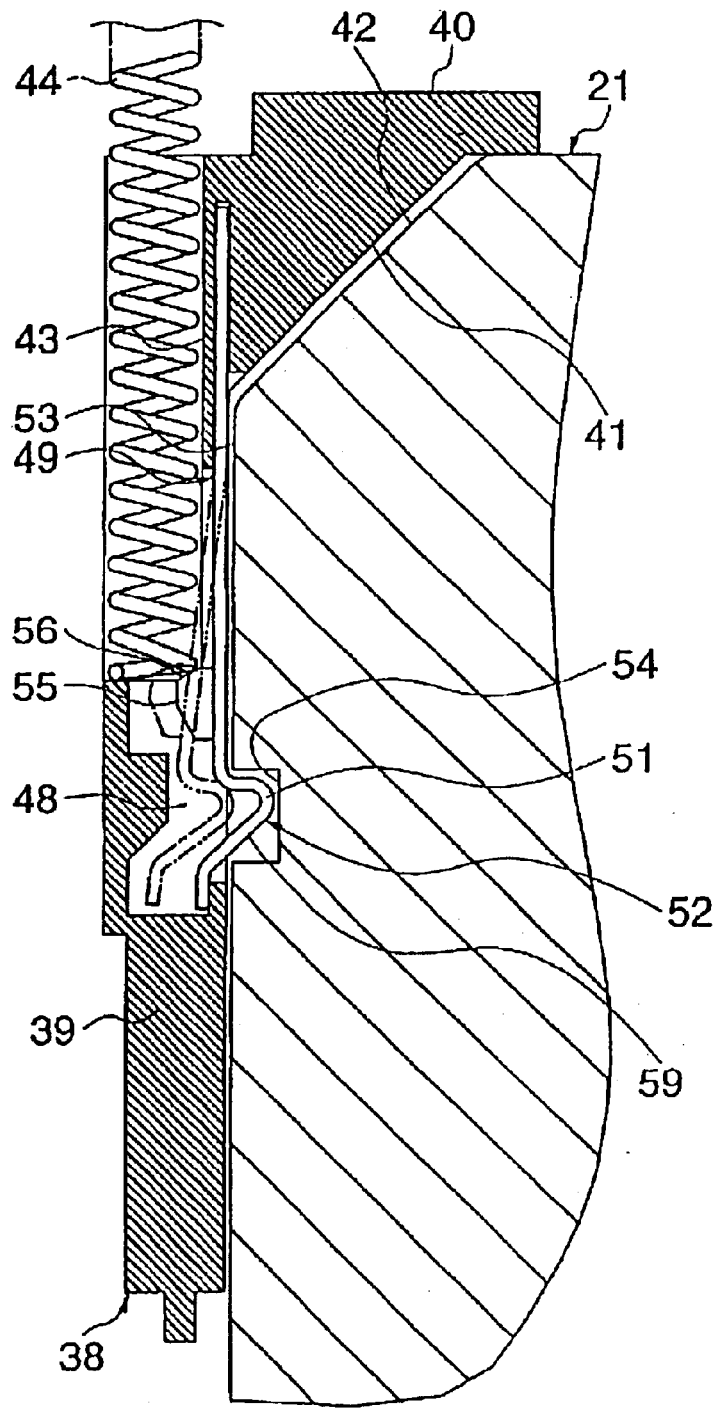
FIGS. 2–6 are sectional views of the card connector to show the operation thereof.

An ejector 38 is provided in the bottom plate 25. The ejector 38 has an elongated guiding section 39 provided along the side wall 29 and an abutting section 40 extending from the front end of the guiding section 39 to the inside of the housing 22. A tapered section 41 is provided at the rear end of the abutting section 40 so that a front cut-off section 42 of the card 21 abuts against the tapered section 41 (FIG. 2). A spring accommodating section 43 is provided in the outside surface of the guiding section 39 to accommodate a spring 44. An front end of the spring 44 is engaged with the cylindrical boss 32 so that the ejector 38 is biased rearwardly. A heart-shaped cam 45 is provided at rear outside of the guiding section 39 and a recess 58 is provided at the rear end of the heart-shaped cam 58. A pin 46 is provided in the heart-shaped cam 45 such that it can swing along the heart-shaped cam 45. The pin 46 is fitted into the pin hole 35 provided at a rear end 47 thereof and biased toward the heart-shaped cam 45 by the pin pressing member 37.

A leaf spring accommodating section 48 is provided in the inside surface of the guiding section 39 to accommodate a leaf spring 49. A tab 50 extends upwardly from the front portion of the leaf spring 49 so that the leaf spring 49 is press-fitted into the ejector 38 via the tab 50 and is flexible in the lateral direction. An engaging section 52 is provided at the rear end of the leaf spring 49 and bent inwardly. The engaging section 52 has a projected top 51 and a sloping surface 59 provided at the rear side of the projected top 51. A engaging piece 55 is provided at the front side of the engaging section 52 and bent outwardly to project into the spring accommodating section 43 through an opening between the inside and outside of the guiding section 39. The engaging piece 55 has a tapered part 56 at the front end thereof to engage with the rear end of the spring 44.

Figure 3:
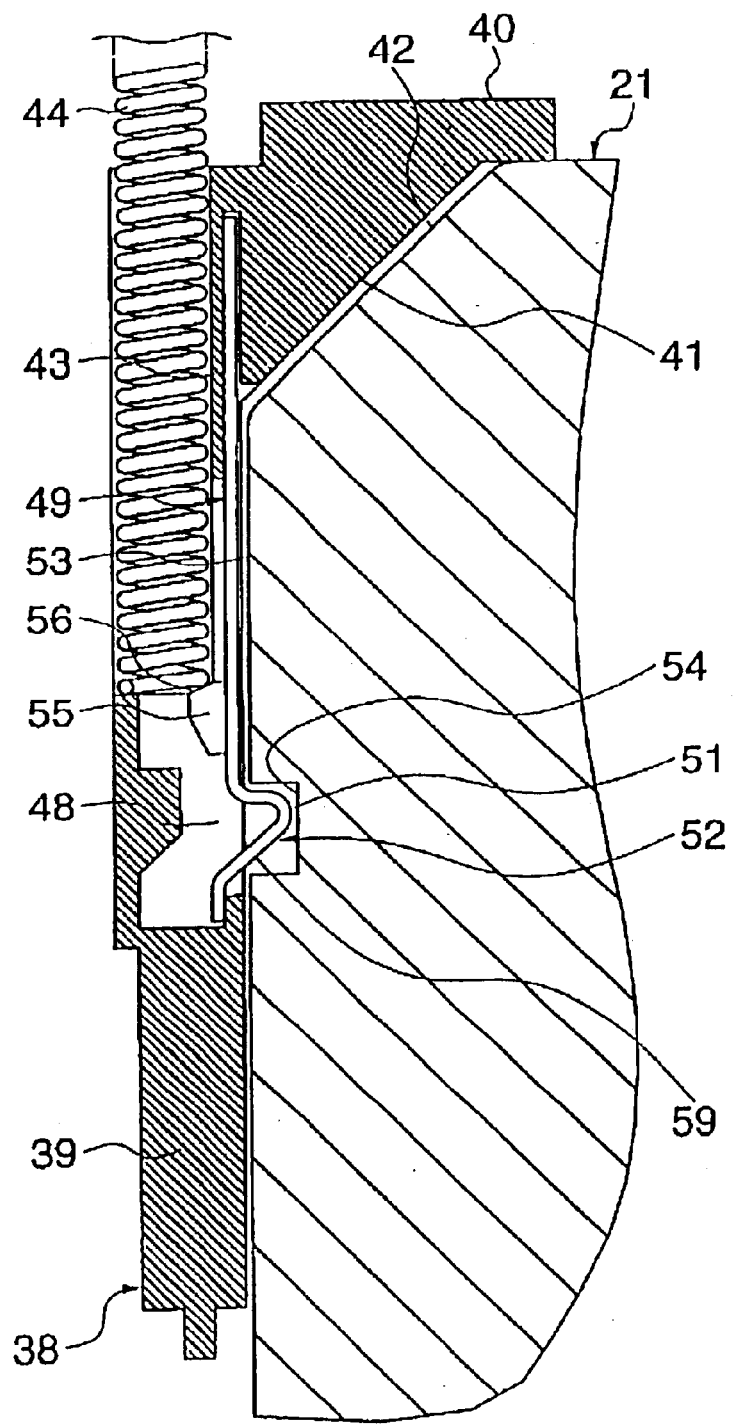

The operation of the card connector will now be described with reference to FIGS. 1–3.

When the card 21 is inserted into the housing 22 from the rear end of the housing 22, the engaging section 52 of the leaf spring 49 abuts against a side edge 53 of the card 21 and flexes outwardly as shown with a broken line in FIG. 2. Then, the engaging section 52 engages an engaging recess 54 so that the card 21 is temporarily held in the ejector 38 (FIG. 2). At this moment, the engaging piece 55 engages the spring 44 via the tapered part 56 to compress the spring 44. As a result, the spring 44 produces a resilient force which is transmitted to the leaf spring 49 through the tapered part 56 so that the leaf spring 49 is pressed inwardly. Where the card is temporarily held, the amount of compression of the spring 44 is so small that the resilient force of the spring 44 or the pressing force to the leaf spring 49 is also small. However, the pressing force is sufficient to hold the engaging condition between the engaging section 52 and engaging recess 54 so that the card 21 does not automatically fall out of the ejector 38. While the card 21 is inserted up to the temporarily-held position, the ejector 38 stands still and the front end 57 of the pin 46 is located at the front side of the heart-shaped cam 45.

When the card 21 is further inserted into the housing 22, the ejector 38 advances with the card 21 against the resilient force of the spring 44 so that the abutting section 40 of the ejector 38 engages the engaging recess 33, and the front edge of the card 21 abuts against the front wall 26. All that while, the engaging piece 55 of the leaf spring 44 further compresses the spring 44 so that the resilient force of the spring 44 becomes stronger. The pin 46 swings along the heart-shaped cam 45 with the rear end 47 thereof as a fulcrum and the front end 57 thereof is positioned at the rear upper side of the heart-shaped cam 45.

When the insertion of the card 21 is stopped, the ejector 38 is slightly moved back together with the card 21 by the resilient force of the spring 44, and the front end 57 of the pin 46 engages the recess 58 of the cam 45, thus the ejector 38 is locked at an insertion position. Respective contacts (not shown) of the card 21 come into contact with corresponding terminals 28 so that the card 21 is electrically connected to a predetermined circuit of the circuit board (not shown). Under this condition, the resilient and pressing force of the spring 44 to press the leaf spring 49 inwardly is stronger than the force in the temporarily-held condition, thus the card 21 is held in the ejector 38 more firmly. Accordingly, the card 21 does not come off from the ejector 38 in an ordinary operation. Occasionally, however, the card 21 is forcibly pulled back and removed. In this case, the engaging section 52 and recess 54 are disengaged by the force, and the leaf spring 49 receives the force in the outward direction and is flexed or deformed outwardly. With the flexure or deformation of the leaf spring 49, the engaging piece 55 further compresses the spring 44 so that the spring 44 absorbs the outward displacement of the leaf spring 49.

Consequently, the side walls 27 and 29 of the housing 22 are not broken or the leaf spring 49 is not deformed by the force applied to the side wall 27 or leaf spring 49. The spring 44 has two functions; that is, moving back the ejector 38 and increasing the resilient force of the leaf spring 49, thus reducing the number of components and manufacturing cost.

In order to remove the card 21 from the housing 22, the card 21 is further pushed forwardly from the insertion position. The front end 57 of the pin 46 and the recess 58 are disengaged from each other and the ejector 38 is moved back to the temporarily-held position with the card 21 by the resilient force of the spring 44. At this point, the engaging section 52 of the leaf spring 49 is engaging the engaging recess 54 of the card 21 by a predetermined force so that the engagement between the engaging section 52 and the engaging recess 54 is not released by the resilient force of the spring 44, thus preventing the card 21 from coming out of the rear end of the housing 22. When, the rear end of the card 21 is pulled rearwardly, the engagement between the engaging section 52 and the engaging recess 54 is released and the card 21 is removed from the housing 22. In the temporarily-held position of the card 21, the spring 44 is compressed by the engaging piece 55 to a predetermined extent so that the pressing force to the engaging section 52 is maintained within a predetermined range and, therefore, the card 21 is easily removed without a strong pulling force.

Figure 4:
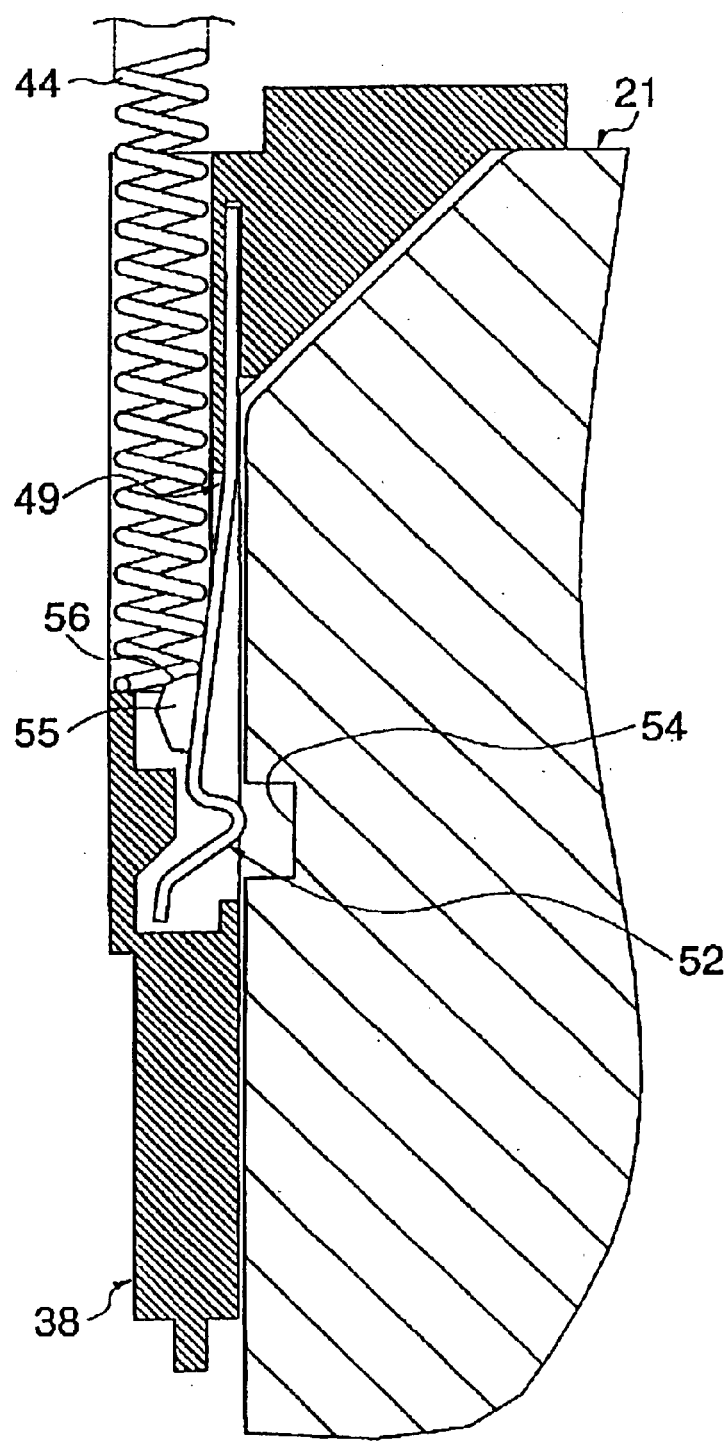

In this embodiment, the card 21 is temporarily held by the ejector 38. However, in FIG. 4, the leaf spring 49 is slightly curved outwardly so that the engaging section 52 and the engaging recess 54 do not engage each other at the temporarily-held position. In this case, the engaging section 52 and the engaging recess 54 are engaged with each other by the resilient force of the spring 44 at the insertion position. This is especially effective for a card having no engaging recess 54. The spring 44 and the engaging section 52 may be integrally provided to the ejector 38.

A card connector according to the second embodiment of the invention will now be described with reference to FIGS. 5–6, where, the same reference numbers are used for identical elements as in FIGS. 1–3 and detailed explanation thereof will be omitted.

The card connector comprises one more additional spring means, a second leaf spring 71 which is cantilevered by the ejector 38 in parallel to the leaf spring 49. The leaf spring 49 in this embodiment does not have the engaging piece 55 but has an abutting face 72 which is provided at the outer surface of the leaf spring 49 behind the engaging section 52 and abuts against the second leaf spring 71. The housing 22 has a projection 73 extending inwardly.

The operation of the card connector according to this embodiment will be described.

Figure 5:
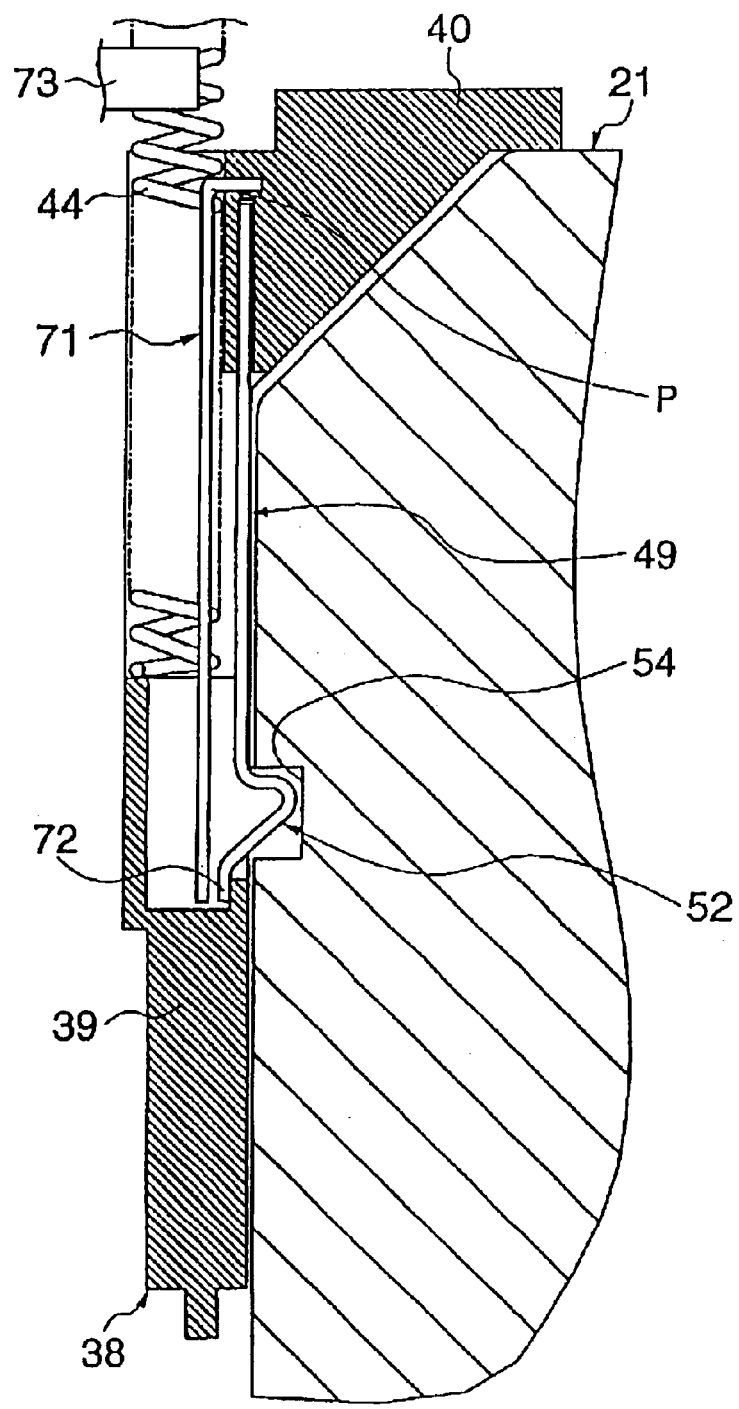

When the card 21 is inserted into the housing 22 from the rear end of the housing 22, the engaging section 52 engages engaging recess 54 of the card 21 so that the card 21 is temporarily held in the ejector 38 (FIG. 5). At this point, the projection 73 is positioned in front of the second leaf spring 71 but does not abuts against the second leaf spring 71. Accordingly, the second leaf spring 71 is flexed with a point P as a fulcrum, at which the second leaf spring 71 is press-fitted into the ejector 38.

Figure 6:
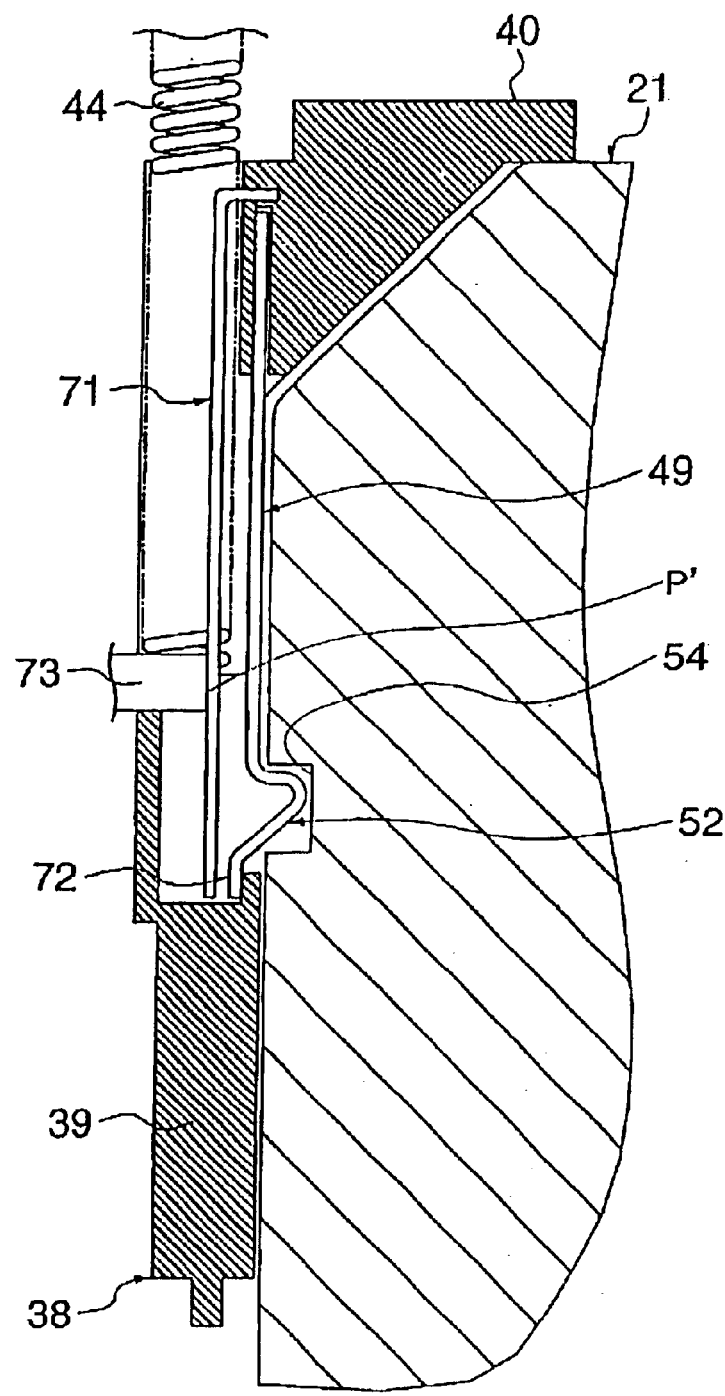
Figure 7:
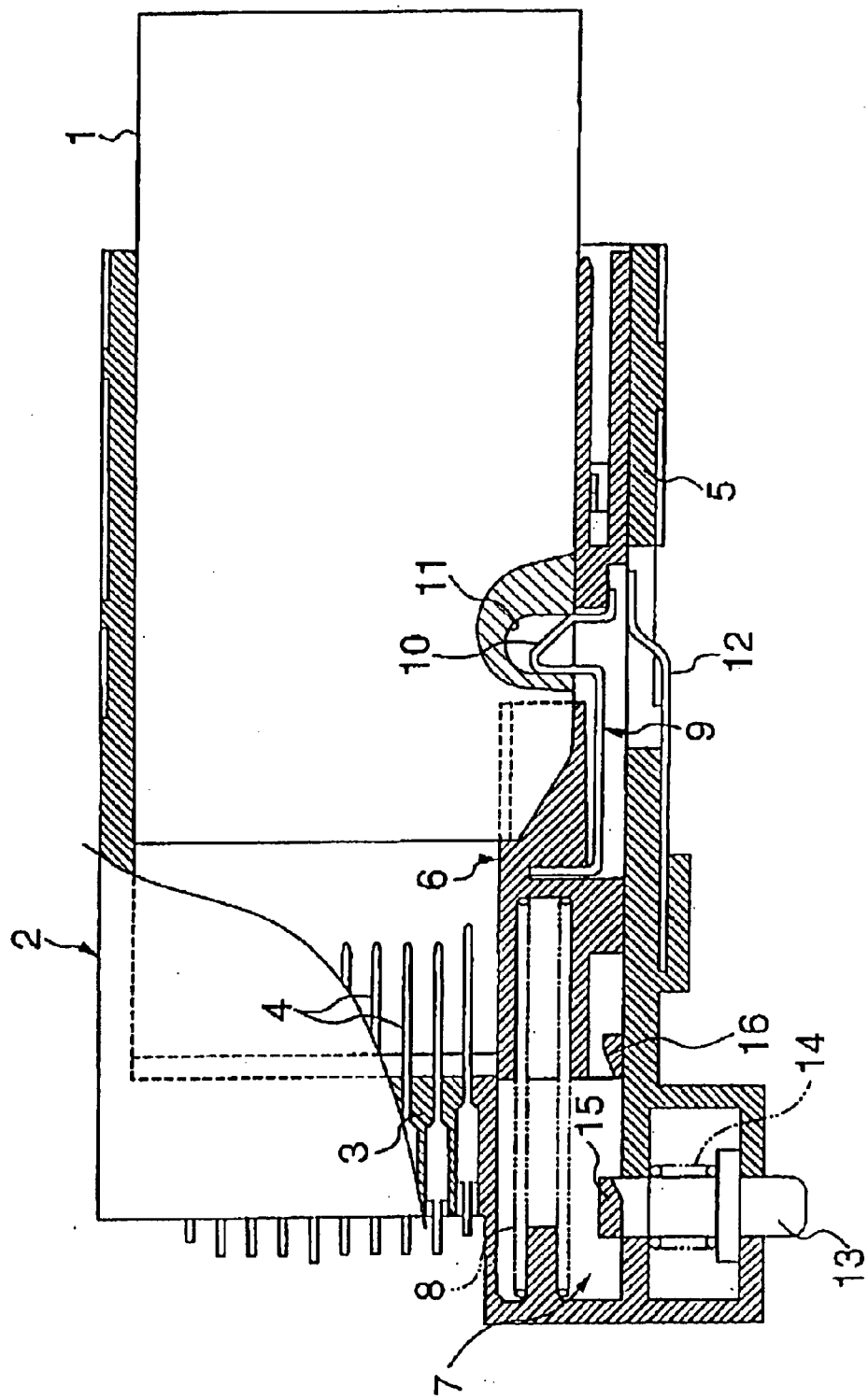
FIGS. 7–9 are sectional views of a conventional card connector.
Figure 8:
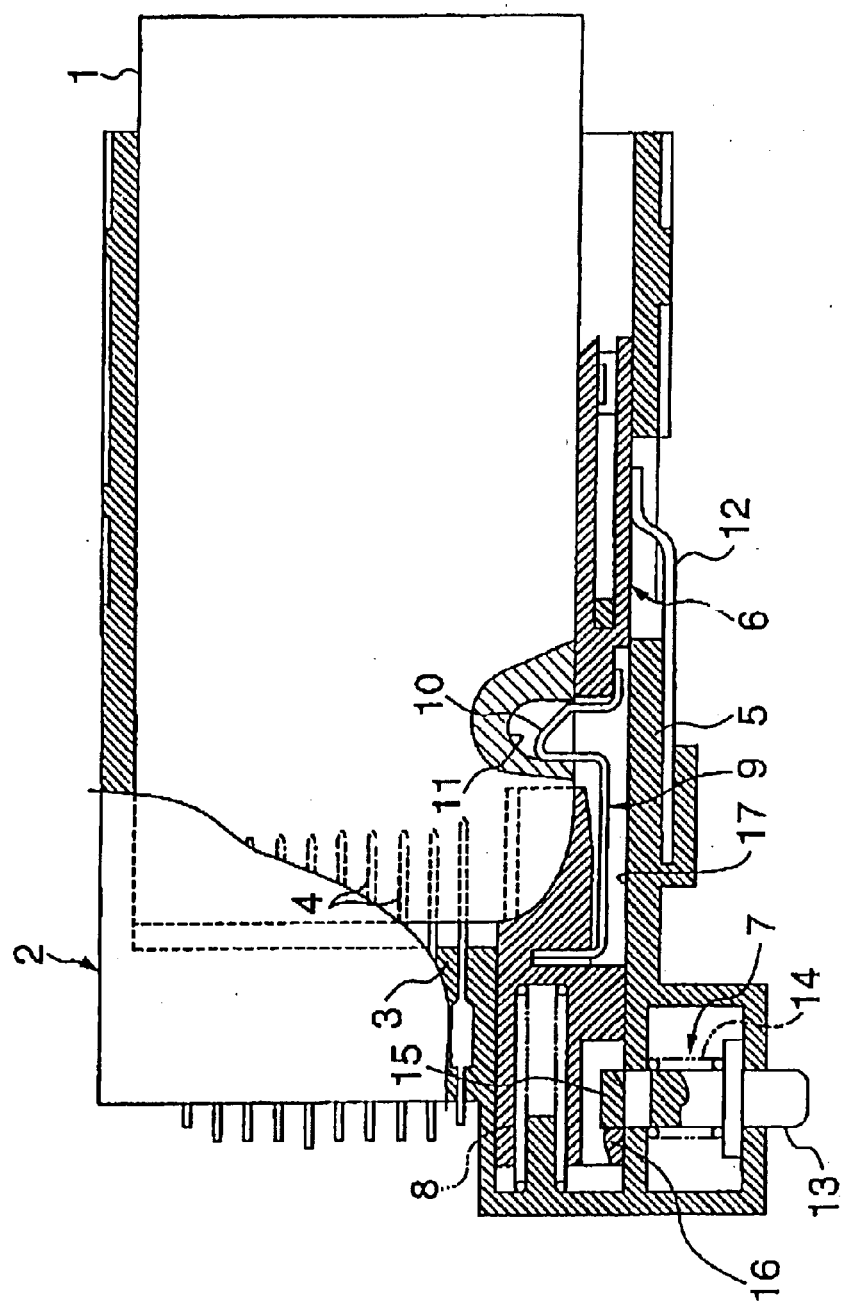
Figure 9:
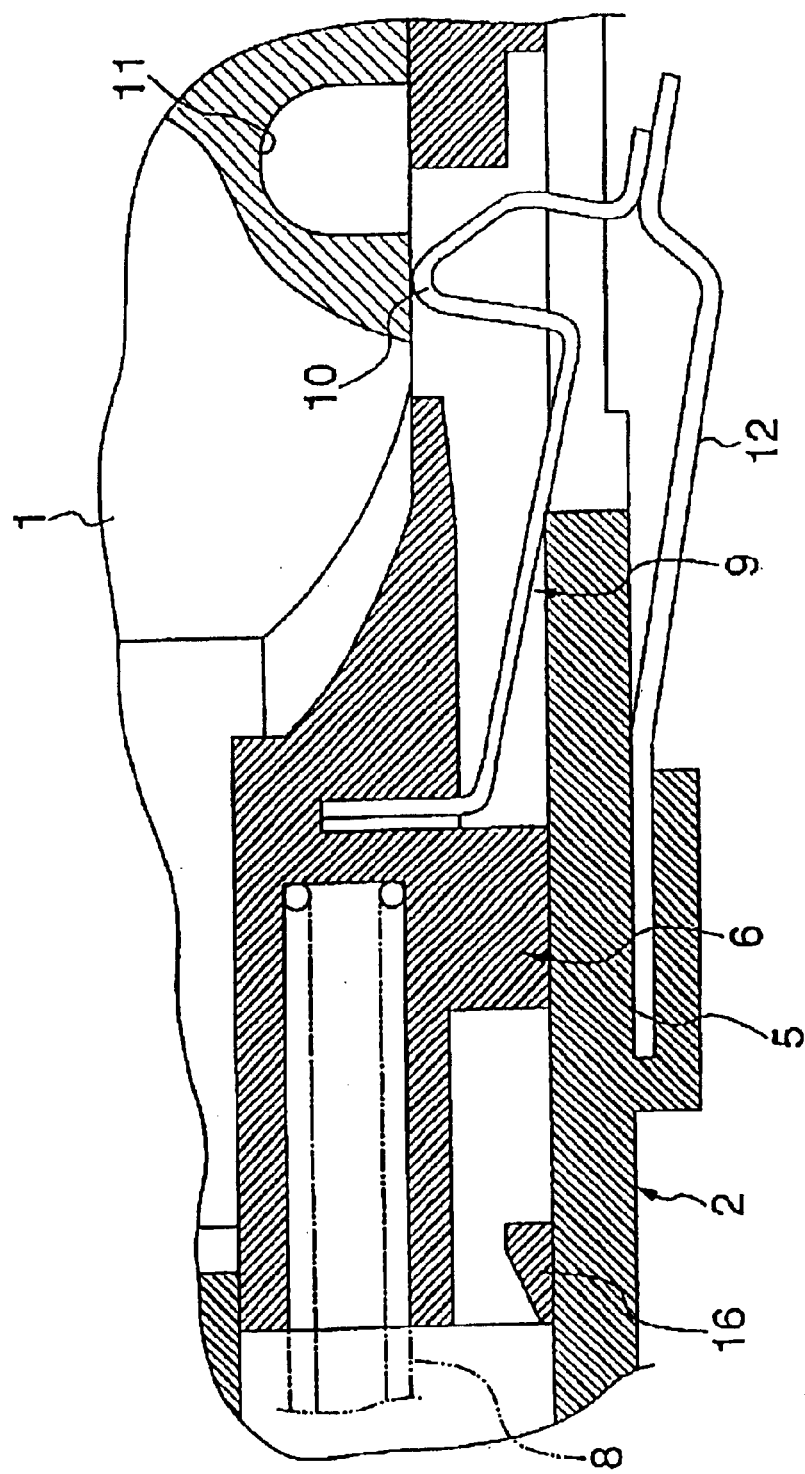

When the card 21 is placed at the insertion position, the projection 73 abuts against the rear outer surface of the second leaf spring 71 (FIG. 6). At this point, the second leaf spring 71 is flexed with P' as a fulcrum, at which the second leaf spring 71 abuts against the projection 73. Accordingly, the resilient force of the second leaf spring 71 to the leaf spring 49 becomes stronger than that in the temporarily-held condition. That is, when the leaf spring 49 is flexed outwardly, the reaction force of the second leaf spring 71 to push back the leaf spring 49 becomes stronger, thus the card 21 does not coming off from the ejector 38 in an ordinary operation. If the card 21 is forcibly pulled backwardly, the engaging section 52 and recess 54 are disengaged by force and the leaf spring 49 is flexed outwardly. With the flexure of the leaf spring 49, the abutting face 72 abuts against the rear end of the second leaf spring 71 to make the second leaf spring 71 flex outwardly. Accordingly, the outward displacement of the leaf spring 49 is absorbed by the second leaf spring 71. Consequently, even in this case, the housing 22 is not broken or the leaf spring 49 is not deformed by the force applied to housing 22 or leaf spring 49.

In order to remove the card 21 from the housing 22, the card 21 is further pushed forwardly from the insertion position to move back the ejector 38 to the temporarily-held position with the card 21 in the same way as in the first embodiment. When, the card 21 is pulled rearwardly, the leaf spring 49 is flexed outwardly and the engagement between the engaging section 52 and the engaging recess 54 is released. The abutting face 72 of the leaf spring 49 abuts against the rear end of the second leaf spring 71 so that the second leaf spring 71 is flexed outwardly with the leaf spring 49. Since the distance between the abutted position between the leaf spring 49 and second leaf spring 71 and the fulcrum point of the second leaf spring 71 is maintained within a predetermined range, the resilient force of the second leaf spring 71 to the leaf spring 49 is appropriate for removing the card 21. Moreover, when the leaf spring 40 is flexed outwardly, the second leaf spring 49 pushes back the leaf spring 49 with a predetermined force and, therefore, the card 21 does not spring out of the housing 22.

In the second embodiment, the front end of the second leaf spring 71 may be supported by the front wall of the housing. In this case, the abutted position between the second leaf spring 71 and the leaf spring 49 is shifted to the front side of the second leaf spring 71 and the resilient force of the second leaf spring 71 to the leaf spring 49 becomes stronger In the first and second embodiments, the leaf spring 49 used as card locking means is not required to be a spring material, such as a leaf spring. Also, it may be made of a resin instead of a metal. In this case, the card locking means is installed in the ejector 38 such that it is rotatable in the lateral direction to the installation point as a fulcrum.

The ejector 39 may be biased rearwardly by a lever instead of the spring 44, which has a linkage to move back-and-forth the ejector 38.

In the embodiments, the heart-shaped cam 45 is used for ejector locking means. However, the invention is not limited to the heart-shaped cam 45. Also, the invention is applicable to a card with no engaging recess 54.

As described above, according to the invention, even if the card is forcibly removed from the insertion position, the spring means absorbs the displacement of the card locking means to prevent the housing from being broken or the card locking means from being deformed, thus increasing the durability of the product.

What is claimed is:

1. A card connector for electrically connecting a card and a circuit board, comprising:
   a housing for accommodating said card detachably in a back-and-forth direction;
   an ejector provided in said housing and movable with said card in said back-and-forth direction;

ejector locking means for locking said ejector at an insertion position in said housing, said ejector locking means being provided in said movable ejector;

card locking means for locking said card to said ejector, said card locking means being provided on said movable ejector; and a spring member having a resilient force with respect to said card locking means, said spring member provided such that said resilient force becomes stronger as said card and said ejector move forwardly.

2. The card connector according to claim 1, wherein said spring member is a spring provided between said housing and said ejector such that said spring biases said ejector rearwardly, and said card locking means is supported by said ejector at one end thereof such that said card locking means is displaced in a lateral direction and has an engaging piece to engage a rear end of said spring and an engaging section to engage said card so that when said engaging piece compresses said spring as said card and said ejector move forward, said resilient force of said spring becomes stronger.

3. The card connector according to claim 1, wherein said card locking means engages said card to temporarily hold said card at a temporarily-held position behind said insertion position.

4. The card connector according to claim 1, wherein said spring member is a leaf spring which is provided in parallel to said card locking means and cantilevered by said ejector, said card locking means is supported by said ejector at one end thereof such that said card locking means is displaced in a lateral direction and has an abutting face to abut against said spring means and an engaging section to engage said card, and said housing has a projection to abut against said spring means so that when an abutted point between said projection and said spring means moves toward a free end of said leaf spring as said card and said spring means move forward, said resilient force of said spring member becomes stronger.

5. The card connector according to claim 1, wherein said spring member is a leaf spring which is provided in parallel to said card locking means and cantilevered by said housing, and said card locking means is supported by said ejector at one end thereof such that said card locking means is displaced in a lateral direction and has an abutting face to abut against said spring means and an engaging section to engage said card so that when an abutted point between said abutted face and said spring means moves toward a cantilevered side of said leaf spring as said card and said spring means move forward, said resilient force of said spring member becomes stronger.

6. The card connector according to claim 2, wherein said card locking means is a leaf spring.

7. The card connector according to claim 2, wherein said card locking means engages said card to temporarily hold said card at a temporarily-held position behind said insertion position.

* * * * *